(12) United States Patent
Kakuchi

(10) Patent No.: US 7,095,509 B2
(45) Date of Patent: Aug. 22, 2006

(54) ABERRATION MEASURING METHOD FOR PROJECTION OPTICAL SYSTEM WITH A VARIABLE NUMERICAL APERTURE IN AN EXPOSURE APPARATUS

(75) Inventor: Osamu Kakuchi, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 304 days.

(21) Appl. No.: 10/791,081

(22) Filed: Mar. 1, 2004

(65) Prior Publication Data
US 2004/0223163 A1 Nov. 11, 2004

(30) Foreign Application Priority Data
Mar. 7, 2003 (JP) .............................. 2003-062016

(51) Int. Cl.
*G01B 9/02* (2006.01)
(52) U.S. Cl. ...................................... 356/515; 356/512
(58) Field of Classification Search ................ 356/515, 356/124, 520, 521, 512, 513, 514, 489, 495
See application file for complete search history.

(56) References Cited

U.S. PATENT DOCUMENTS

2004/0042094 A1* 3/2004 Matsuyama ................. 359/822

FOREIGN PATENT DOCUMENTS

JP    2000-277412    10/2000

* cited by examiner

*Primary Examiner*—Gregory J. Toatley, Jr.
*Assistant Examiner*—Marissa J. Detschel
(74) *Attorney, Agent, or Firm*—Morgan & Finnegan, LLP

(57) ABSTRACT

A method disclosed in this specification is an aberration measuring method in which a light flux converged by a condensing optical system is made incident on a optical system to be measured, the light flux that has passed through the optical system to be measured is reflected by a reflecting optical system having a center of curvature at a light convergence point on a light emergence side of the optical system to be measured is made incident on the optical system to be measure again, and wavefront aberration of the optical system to be measured is detected as interference fringes using the light flux that has passed through the optical system to be measured again. Measurement is carried out while changing the numerical aperture of the optical system to be measured to a numerical aperture larger than a numerical aperture in the actual use, thereby realizing highly precise measurement of the wavefront aberration all over the effective numerical aperture of the optical system to be measured.

2 Claims, 7 Drawing Sheets

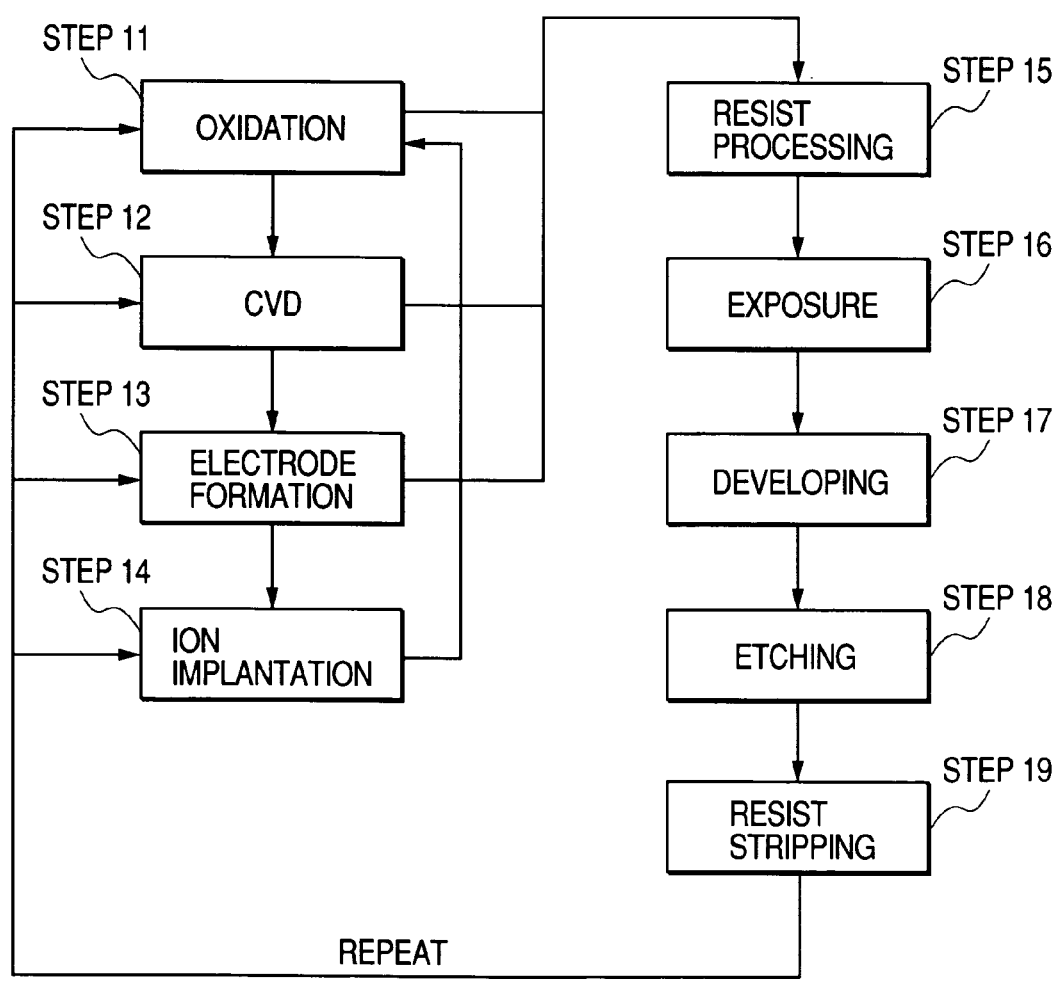

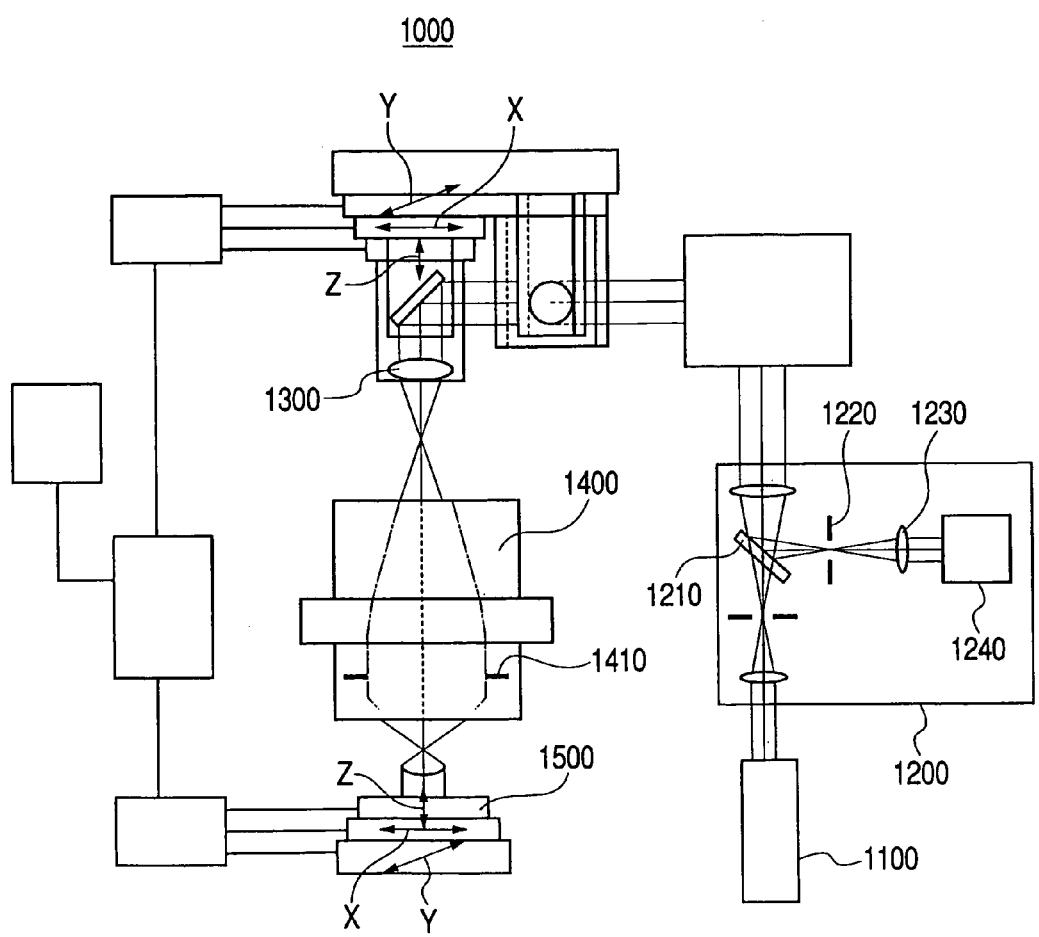
PRIOR ART FIG. 7

*FIG. 8A*     PRIOR ART
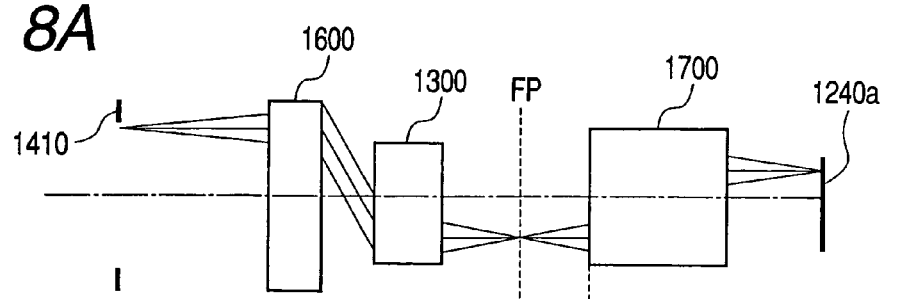
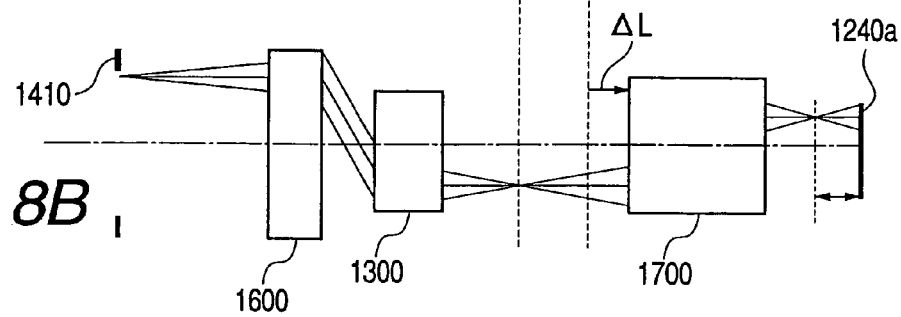
*FIG. 8B*
*FIG. 9*     PRIOR ART
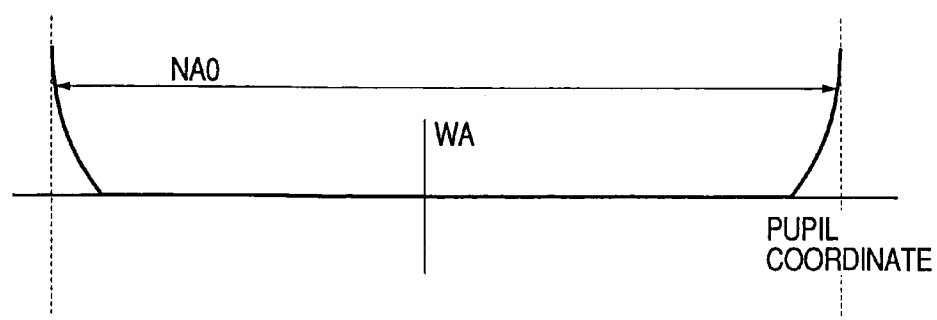

ABERRATION MEASURING METHOD FOR PROJECTION OPTICAL SYSTEM WITH A VARIABLE NUMERICAL APERTURE IN AN EXPOSURE APPARATUS

BACKGROUND OF THE INVENTION

1. Field of the Invention

The present invention relates to a method for measuring aberration, and particularly to an aberration measuring method for measuring wavefront aberration of an optical system such as a projection optical system for transferring a pattern on a mask onto a photosensitive substrate. Such a projection optical system is used for example, in a lithography process for exposing an article to be processed such as a single crystal substrate like a semiconductor wafer or a glass substrate used for a liquid crystal display (LCD).

2. Related Background Art

In the process for manufacturing microscopic semiconductor devices such as semiconductor memories or logic devices utilizing a photolithography techonology, a projection exposure apparatus for projecting a circuit pattern formed on a reticle or a mask (these terms will be interchangeably used in this specification) onto a wafer or the like by a projection optical system so as to transfer the circuit pattern has been conventionally used.

The projection exposure apparatus is required to transfer a pattern on a reticle at a predetermined magnification (i.e. a reduction ratio) precisely. In order for this requirement to be met, it is important to use a projection optical system that has a superior imaging performance with extremely reduced aberrations. In recent years particularly, with rapid miniaturization of semiconductor devices, patterns beyond ordinary imaging performance are often required to be transferred, and the transferred patterns have become sensitive to aberrations of optical systems. On the other hand, increases in the exposure area and the numerical aperture (NA) of the projection-optical system have been required. This makes aberration correction all the more difficult. In order to attain effective aberration correction, it is necessary to measure wavefront aberration with high precision.

As an apparatus for measuring wavefront aberration of an optical system with high precision, an apparatus utilizing a Fizeau interferometer or a Twyman-Green interferometer has been conventionally used. In the following, the principle of measuring the wavefront aberration of a projection lens equipped in a projection exposure apparatus as a lens to be measured using a Fizeau interferometer will be described with reference to FIGS. 7 to 9. FIG. 7 is a diagram schematically showing a conventional aberration measuring apparatus 1000.

Light emitted from a light source 1100 is guided to an interferometer unit 1200, transmitted through a half mirror 1210, converted into parallel light by a collimator lens 1220, transmitted through a TS lens 1300 and a lens to be measured 1400, and reflected by an RS mirror 1500. The light reflected by the RS mirror 1500 is made to pass through the lens to be measured 1400 and the TS lens 1300 in the opposite direction, then reflected by the half mirror 1210 and made incident on a CCD camera 1240 as light to be measured (or measurement light) by means of an imaging lens 1230.

On the other hand, the light reflected by the last surface (i.e. the Fizeau surface) of the TS lens 1300 is also reflected by the half mirror 1210 and made incident on the CCD camera 1240 as reference light by means of the imaging lens 1230. These two light fluxes (i.e. the measurement light and the reference light) interfere with each other, so that interference fringes are detected on the CCD camera 1240. The wavefront aberration can be determined by calculation based on the interference fringes. The TS lens 1300 and the RS mirror 1500 are scanned along the optical axis direction, so that the wavefront aberration can be measured continuously by the so-called fringe scanning method. The parts in FIG. 7 that are not designated by reference signs will be described later in the description of the embodiments, and so the description is omitted here.

An aperture stop 1410, which determines the numerical aperture of the lens to be measured 1400, is disposed at a position optically conjugate with the CCD camera 1240. This arrangement will be specifically described in the following with reference to FIGS. 8A and 8B. FIGS. 8A and 8B are block diagrams schematically showing the positional relationship between the aperture stop 1410 and the CCD camera 1240 shown in FIG. 7.

The aperture stop 1410 of the lens to be measured 1400 is conjugate with the front focal plane FP (on the interferometer unit 1200 side) of the TS lens 1300 with respect to the downstream optical system (that is, the lens system on the image plane side of the aperture stop 1410) 1600 of the lens to be measured 1400 and the TS lens 1300. In addition, the front focal plane FP of the TS lens 1300 is conjugate with the detection surface 1240a of the CCD camera 1240 with respect to an interference optical system (that is, the collimator lens 1220 and the imaging lens 1230 that constitute the interferometer unit 1200) 1700. To be precise, the TS lens 1300 is disposed at a measurement position on the axis and the position of the detection surface 1240a is adjusted in such a way that the aperture stop 1410 and the detection surface 1240a become optically conjugate with each other in the assembling and adjusting process.

Consequently, although the diameter of the aperture stop 1410 of the lens to be measured 1400 is equal to the effective numerical aperture of the lens to be measured 1400, diffracted light from the edge of the aperture stop 1410 does not affect the wavefront aberration detected based on the interference fringes, since the diffracted light is imaged on the detection surface 1240a.

However, when the TS lens 1300 is displaced to an off-axis measurement position, as shown in FIG. 8B, the optically conjugate relationship between the aperture stop 1410 of the lens to be measured 1400 and the detection surface 1240a of the CCD camera 1240 is no longer kept. This is because the interference optical system 1700 is shifted relatively to the lens to be measured 1400 with the displacement of the TS lens 1300 and the distance between the TS lens 1300 and the interference optical system 1700 changes by $\Delta L$ (the shift amount of the TS lens 1300).

In the case that the aperture stop 1410 of the lens to be measured 1400 and the detection surface 1240a of the CCD camera 1240 are out of the optically conjugate relationship, the diffracted light will spread on the detection surface 1240a. In that case, a rapid change in the phase of the measured wavefront aberration will be caused in the periphery of the effective numerical aperture $NA_0$ (i.e. the pupil) of the lens to be measured 1400 on account of an influence of the diffracted light from the aperture stop 1410. This will cause a considerable measurement error. Here, FIG. 9 is a diagram schematically showing the wavefront aberration in the periphery of the pupil of the lens to be measured 1400 in the conventional aberration measuring apparatus 1000.

Particularly, in the case that the measurement light is made incident from the object plane side as is the case with the aberration measuring apparatus 1000 shown in FIG. 7, the shift amount of the TS lens 1300 between the on-axis position and the off-axis position becomes larger as compared to the case in which the measurement light is made incident from the image side (for example, in the case of a projection lens of 5× magnification, the shift amount ΔL becomes 25 times larger). Consequently, an error of the wavefront aberration in the periphery of the pupil due to the spread of the diffracted light becomes larger.

On the other hand, it is possible to always keep the optically conjugate relationship between the aperture stop 1410 and the detection surface 1240*a* by shifting the CCD camera 1240 or the imaging lens 1230 along the optical axis in accordance with the measured image height. However, that method is not desirable, since the interference fringes will be shifted on the CCD camera 1240 on account of eccentricity generated upon shifting the CCD camera 1240 and correction needs to be carried out in the wavefront aberration calculation area for every image height of the central coordinate.

SUMMARY OF THE INVENTION

An exemplary object of the present invention is to provide an aberration measuring method with which wavefront aberration can be measured with high precision all over the effective numerical aperture of a lens to be measured.

A method according to one aspect of the present invention that is intended to attain the aforementioned object is an aberration measuring method in which a light flux converged by a condensing optical system is made incident on an optical system to be measured, the light flux that has passed through the optical system to be measured is reflected by a reflecting optical system having a center of curvature at a light convergence point on a light emergence side of the optical system to be measured is made incident on the optical system to be measure again, and wavefront aberration of the optical system to be measured is detected as interference fringes using the light flux that has passed through the optical system to be measured again. The method is characterized by a step of setting a numerical aperture of the optical system to be measured to a numerical aperture larger than a numerical aperture in a case of actually using the optical system to be measured (e.g., when the optical system to be measured is a projection optical system for an exposure apparatus, the numerical aperture is set to a maximum numerical aperture of an actual exposing operation.); and a step of measuring wavefront aberration of the optical system to be measured at the set numerical aperture.

Other objects and features of the present invention will become apparent from the description of preferred embodiments that will be made in the following with reference to the accompanying drawings.

BRIEF DESCRIPTION OF THE DRAWINGS

FIG. 6 is a detailed flow chart of the wafer process shown in step 4 of the flow chart of FIG. 5.

FIG. 7 is a diagram schematically showing a conventional aberration measuring apparatus.

FIGS. 8A and 8B are block diagrams showing the positional relationship of the aperture stop and the CCD camera shown in FIG. 7.

FIG. 9 schematically shows wavefront aberration in the periphery of the lens to be measured in the conventional aberration measuring apparatus.

DETAILED DESCRIPTION OF THE PREFERRED EMBODIMENTS

Figure 1:
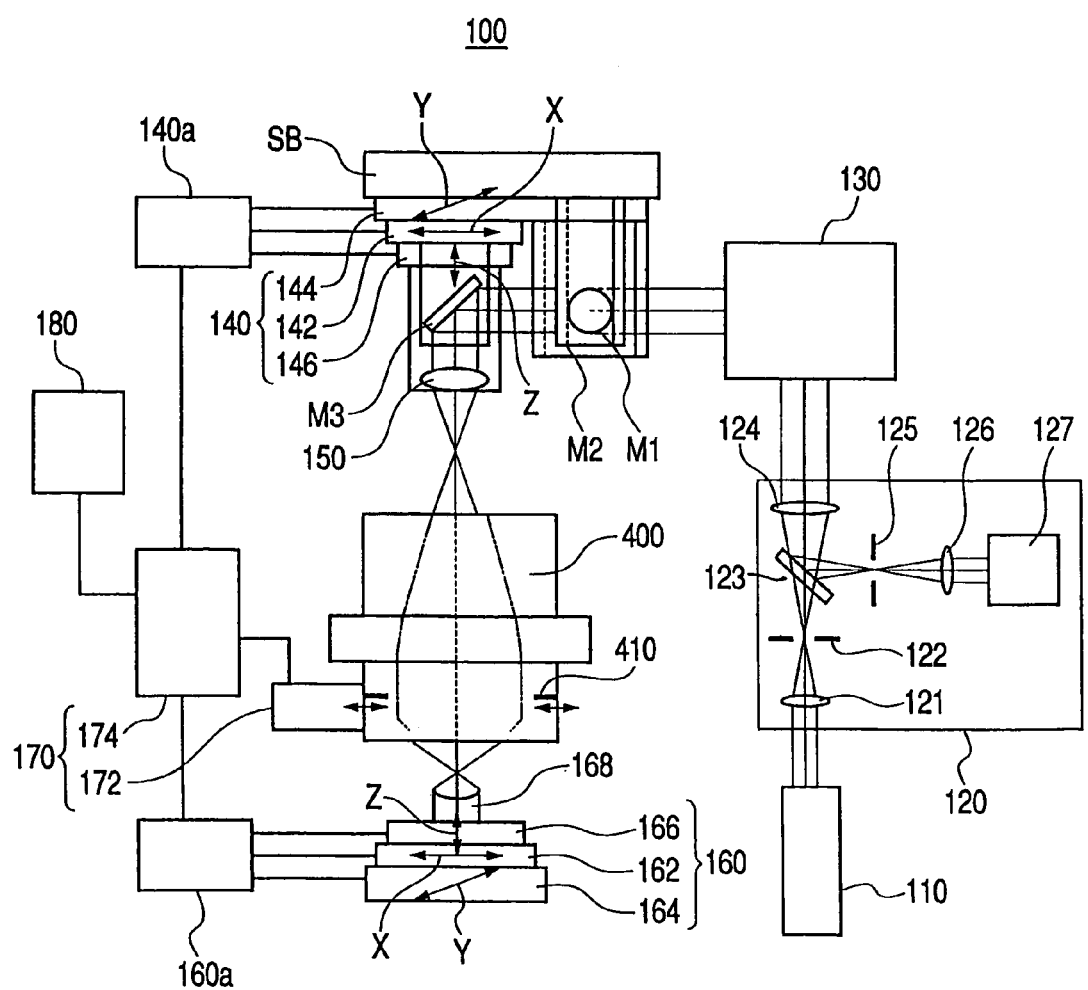
FIG. 1 is a diagram schematically showing exemplary embodiment of an aberration measuring apparatus 100 according to one aspect of the present invention.

In the following, an aberration measuring apparatus 100 and an exposure apparatus 200 according to one aspect of the present invention will be described with reference to the accompanying drawings. Throughout the drawings, the same parts are designated by the same reference numerals and redundant descriptions will be omitted. FIG. 1 is a diagram schematically showing the structure of an exemplary embodiment of the aberration measuring apparatus 100 according to one aspect of the present invention.

The aberration measuring apparatus 100 constitutes a Fizeau interferometer provided with a light source 110 for emitting a considerably coherent light flux (e.g. laser light) with an oscillation wavelength close to the wavelength at which a lens to be measured 400 is used. The aberration measuring apparatus 100 is adapted to measure the wavefront aberration of the lens to be detected 400 such as a projection optical system of an exposure apparatus. In the following, the description of the embodiment will be made with reference to the case in which the lens to be measured 400 is a projection optical system.

As shown in FIG. 1, the aberration measuring apparatus 100 is provided with a light source 110, an interferometer unit 120, a deflecting optical system 130, a TS-XYZ stage 140, a TS lens 150, an RS-XYZ stage 160, a numerical aperture changing means 170 and a main control apparatus 180.

The aberration measuring apparatus 100 causes measurement light and reference light to overlap with each other to form interference fringes, to thereby measure the wavefront aberration of the lens to be measured 400. Firstly, the reference light will be described. A light flux emitted from the light source 110 is guided to the interferometer unit 120. In the interior of the interferometer unit 120, the light flux is converged on a spatial filter 122 by means of a condenser lens 121. The diameter of the spatial filter 122 is set to about half the Airy disk diameter, which is determined by the numerical aperture (NA) of a collimator lens. As a result, the light emergent from the spatial filter 122 becomes an ideal spherical wave, which is transmitted by a half mirror 123, converted into parallel light by a collimator lens 124 and emitted from the interferometer unit 120. After that, the light is guided by the deflecting optical system 130 to the position above the object plane (corresponding to the surface of a reticle set on the exposure apparatus) of the lens to be measured 400 so as to be made incident on the TS-XYZ stage 140 (including an X stage 142, a Y stage 144 and Z stage 146).

The parallel light incident on the TS-XYZ stage 140 is reflected by a mirror M1 fixed on a stage base SB toward the Y direction, then reflected by a mirror M2 that is movable in the Y direction toward the X direction, and then reflected by a mirror M3 that is movable in the X direction toward the Z direction. Furthermore, the light is converged by the TS lens 150 onto the object plane of the lens to be measured 400. After transmitted through the lens to be measured 400, the light is converged and re-imaged on the image plane (corresponding to the surface of a wafer set on the exposure apparatus).

After that, the re-imaged light is reflected by an RS mirror 168 disposed on the RS-XYZ stage 160 (including an X stage 162, a Y stage 164 and a Z stage 166). Then, the light travels back through the substantially the same optical path including the lens to be measured 400, the TS lens 150, the mirror M3, the mirror M2, the mirror M3 and the deflecting optical system 130 and enters the interferometer unit 120 from the reverse direction. As will be seen from the above description, the center of curvature of the RS mirror 168 is on the image plane of the lens to be measured 400 (or at the light convergence point).

The light that has entered the interferometer unit 120 is transmitted through the collimator lens 124, reflected by the half mirror 123, and converged on a spatial filter 125. The spatial filter 125 is provided in order to block stray light and steep wavefront. The light that has passed through the spatial filter 125 is incident on the CCD camera 127 as a substantially parallel light flux.

Next, referring to the reference light, a part of the light flux incident on the TS lens 150 in the forward path is reflected by the TS lens 150. More specifically, surface reflection light reflected by the Fizeau surface (i.e. the last surface) of the TS lens 150 is generated. Such reflection light is caused to travel back through the optical path including the mirror M3, the mirror M2, the mirror M1, the deflecting optical system 130, the collimator lens 124, the half mirror 123, the spatial filter 125 and the imaging lens 126 in the reverse direction so as to be made incident on the CCD camera 127 as the reference light. Thus, the CCD camera 127 detects interference fringes formed by superposition of the measurement light and the reference light.

The TS-XYZ stage 140 (including the X stage 142, the Y stage 144 and the Z stage 146) and the RS-XYZ stage (including the X stage 162, the Y stage 164 and the Z stage 166) are adapted to enable continuous measurement of the wavefront aberration at any image point (or any object point) of the lens to be measured 400 under control of a control portion 174 of numerical aperture changing means 170 (which will be described later) via a TS-XYZ stage driving portion 140a and an RS-XYZ driving stage 160a.

Although in the aberration measuring apparatus 100 according to this embodiment light converged on the object side (i.e. the reticle setting side) of the lens to be measured 400 by the TS lens 150 is first made incident on the lens to be measured 400, light may be first made incident on the lens to be measured from the image side (i.e. the wafer setting side). In the latter case, the light convergence point of the TS lens 150 should be arranged on the image plane of the lens to be measured 400 and the center of curvature of the RS mirror 168 should be arranged on the object plane of the lens to be measured 400.

In the following, the numerical aperture changing means 170 will be described. The numerical aperture changing means includes a driving portion 172 for driving an aperture stop 410 provided in the lens to be measured 400 and a control portion 174 for controlling the driving portion 172.

The numerical aperture changing means 170 is adapted to change the numerical aperture of the lens to be measured 400 by changing the stop diameter of the aperture stop 410 in such a way that influence of phase variation on the interference fringes detected by the CCD camera 127 caused by diffracted light that is generated when light passes through the aperture stop 410 is reduced. Although in the apparatus according to this embodiment, the control portion is adapted to control both the TS-XYZ stage driving portion 140a and the RS-XYZ driving stage 160a, control portions for independently controlling these parts may be provided.

The numerical aperture changing means 170 can vary the numerical aperture of the lens to be measured 400 and it can set the maximum stop diameter to a predetermined numerical aperture sufficiently larger than the maximum effective numerical aperture $NA_0$ in the actual use so that the diffracted light does not affect the wavefront measurement value even at the outermost off-axis measurement position. Before measurement, the aperture stop 410 of the lens to be measured 400 is opened up to the maximum effective numerical aperture in the actual use by means of the aperture stop changing means 170, and the wavefront aberration is measured under that state.

Note that the term of "maximum effective numerical aperture value in the actual use" is a maximum numerical aperture value in a range in which an imaging performance is guaranteed in case of using the lens to be measured 400 in accordance with an aim. For example, when the lens to be measured 400 is the projection optical system of the exposure apparatus for manufacturing the semiconductor device or the like, it is directed to the maximum numerical aperture capable of being used for performing a projection exposure in the exposure apparatus actually.

In connection with this, the effective diameter of the lenses that constitute the lens to be measured 400 is designed to be sufficiently large so that the aperture stop 410 can be changed to the maximum diameter that exceeds the effective numerical aperture $NA_0$ in the actual use. In addition, the apparatus is constructed in such a way that the diameter of the aperture stop 410 can be changed before measurement by the main control apparatus 180 via the driving portion 172 as the need arises. The diameter of the aperture stop 410 may be changed before measurement by an operator through a manual operation of the driving portion 172.

In the following, a sequence of the measurement is described. At the first, the numerical aperture changing means 170 changes the diameter of the aperture stop 410 so as to set the numerical aperture of the lens to be measured 400 to the numerical aperture larger than the effective maximum numerical aperture $NA_0$ in the actual use. Then, for a plurality of the measurement on-axis points and off-axis points, the wavefront aberrations are sequentially measured. In the case that the TS lens 150 and the RS mirror 168 are shifted to an off-axis measurement position, the aperture stop 410 of the lens to be measured 400 and the detection surface of the CCD camera 127 are out of the conjugate relationship. However, since the numerical aperture of the lens to be measured 400 is set to larger than the effective maximum numerical aperture before measurement, it becomes possible to measure the wavefront aberration with high precision at all of the measurement points without influence of light diffracted by the aperture stop 410. In the following, the reason thereof is described.

Figure 2:
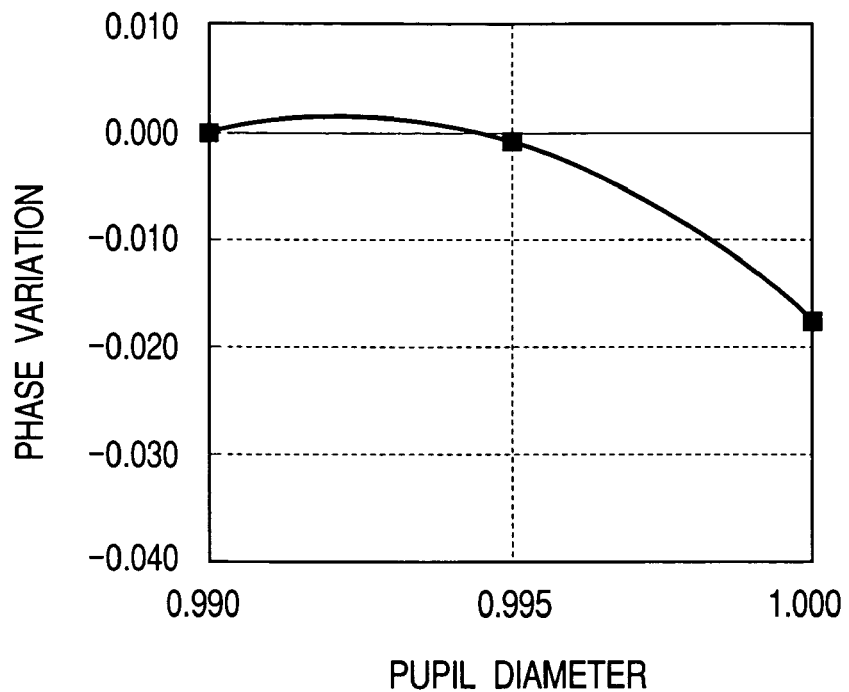
FIG. 2 is a graph showing a phase variation of measurement light caused by an influence of diffraction that occurs in the vicinity of the edge of an aperture stop of a lens to be measured, wherein the edge position is represented as 1.0.

FIG. 2 is a graph showing phase variation of the measurement light caused by influence of diffraction in the vicinity of the edge, where the edge position of the aperture stop 410 of the lens to be measured 400 is represented as 1.0.

This graph shows the result of calculation of Fresnel diffraction image at a defocus amount of 80 mm, under the assumption that the shift amount of the TS lens 150 is 80 mm. In addition, the pixel size of the CCD camera 127 at the pupil was assumed to be 0.5% of the pupil diameter and the diffraction image was averaged in the pixels of the CCD camera 127.

Referring to FIG. 2, it will be understood that in the case that the shift amount ΔL of the TS lens 150 is 80 mm (which is the sum of the shift amount in the X direction and the shift amount in the Y direction), the phase variation occurs in the range of 0.5% from the edge, but the phase variation does not occur in the inner area other than that range. In order to make the maximum numerical aperture $NA_1$ at the measurement of the wavefront aberration, 0.5% larger than the effective maximum numerical aperture $NA_0$, the control portion 174 should control the driving portion 172 in such a way that the effective maximum numerical aperture $NA_0$ and the numerical aperture $NA_1$ satisfy the following formula.

$$NA_0/NA_1 < 0.995 \qquad \text{formula 1}$$

Figure 3:
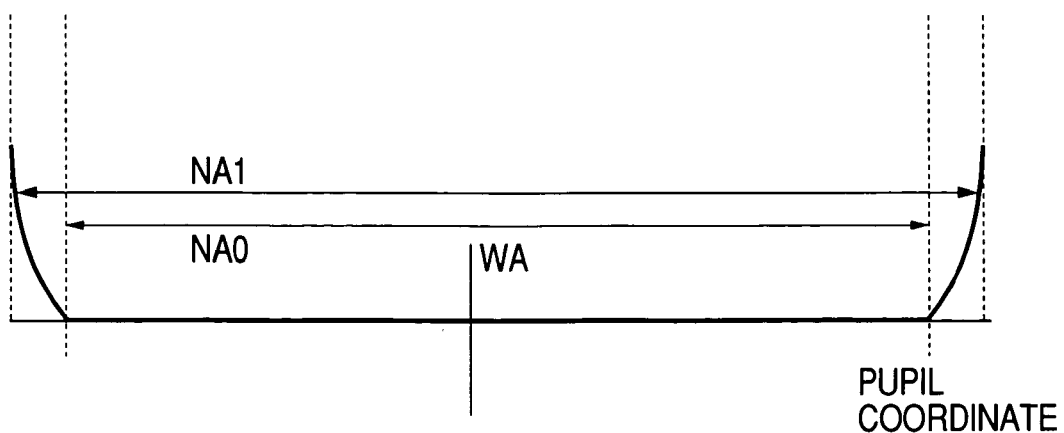
FIG. 3 schematically shows wavefront aberration in the periphery of the lens to be measured in the aberration measuring apparatus shown in FIG. 1.

Under the state that the numerical aperture of the lens to be measured 400 satisfies the above formula 1, measurement of the wavefront aberration can be performed on the on-axis point and an arbitrary off-axis point. Here, with reference to FIG. 3, the description is made for influence of diffracted light on the measurement of the wavefront aberration in the state of the numerical aperture $NA_1$. FIG. 3 shows a wavefront aberration at a section of the circular pupil. Abscissa axis is a coordinate system of the section through a center of the pupil and ordinate is a value of the wavefront aberration. The phase variation is limited to the numerical aperture range $NA_0$ to $NA_1$ of the lens to be measured 400 (a range in which the wavefront aberration changes in FIG. 3.) as shown in FIG. 3, and the phase variation does not occur in the area that does not exceed the effective numerical aperture of the lens to be measured 400. Consequently, highly precise measurement of the wavefront aberration is made possible all over the area within the effective numerical aperture of the lens to be measured 400. In connection with the above, FIG. 3 schematically shows the wavefront aberration in the periphery of the pupil of the lens to be measured 400 in the aberration measuring apparatus 100.

Figure 4:
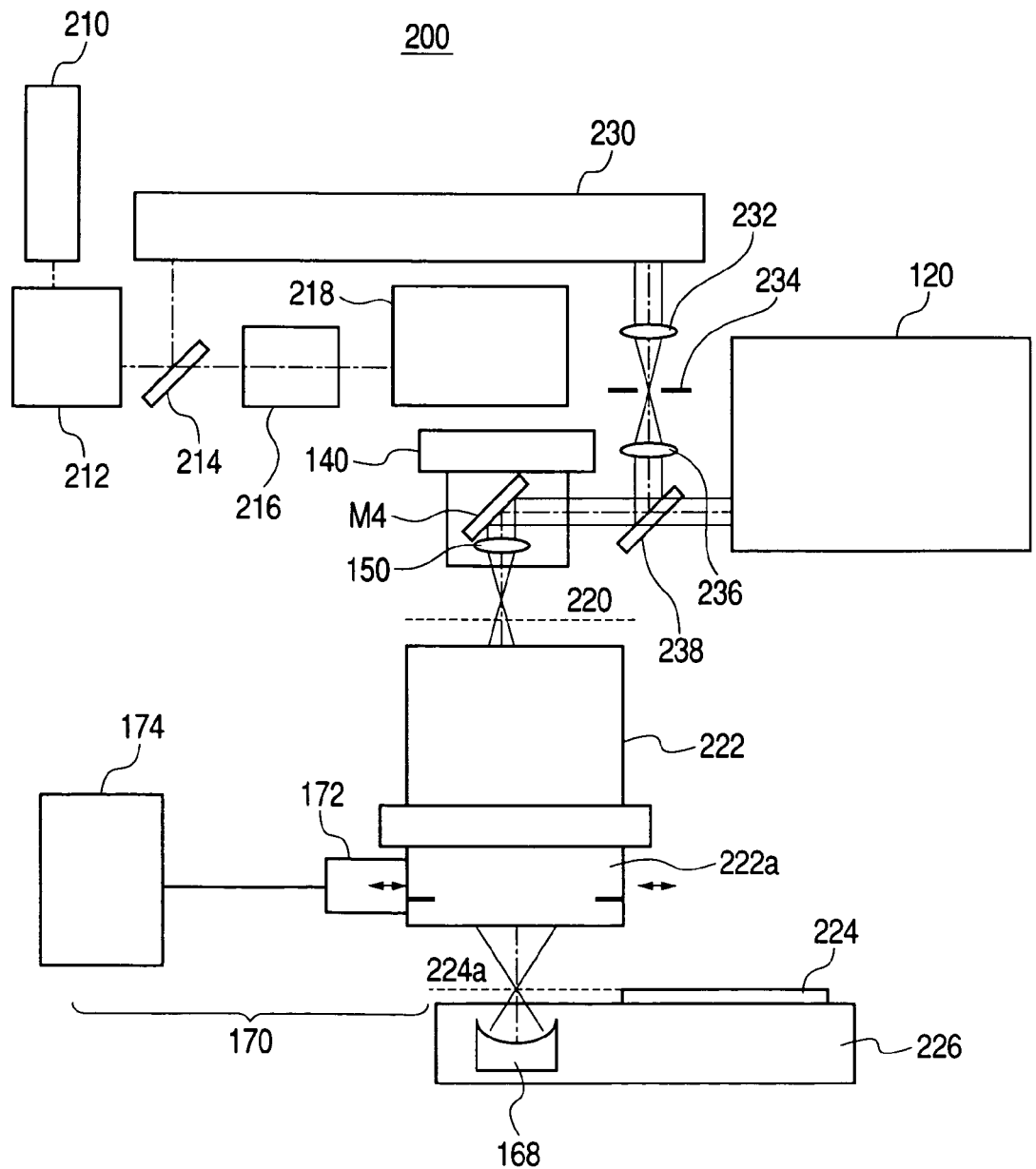
FIG. 4 is a diagram schematically showing an exemplary embodiment of an exposure apparatus according to one aspect of the present invention.

In the following, an exposure apparatus 200 according to one aspect of the present invention will be described with reference to FIG. 4. FIG. 4 is a diagram schematically showing the structure of an exemplary embodiment of an exposure apparatus 200 according to one aspect of the present invention. The exposure apparatus 200 is an exposure apparatus in which the aberration measuring apparatus 100 is applied. The exposure apparatus 200 is a projection exposure apparatus for exposing a circuit pattern formed on a mask 220 onto a wafer 224 by a step and scan process or a step and repeat process. Such an exposure apparatus is suitable for the lithography process of a submicron order or quarter-micron order or less. The following description of this embodiment will be made with reference to a step and scan exposure apparatus (which is also referred to as a "scanner") by way of example. Here, the "step and scan process" is a process in which a wafer is continuously scanned relative to a mask so that the mask pattern is exposed onto the wafer, and then the wafer is stepped to the next exposure area after completion of one exposure shot. On the other hand, the "step and repeat process" is a process in which a wafer is stepped to the next exposure area every time batch exposure is performed.

The basic structure of the exposure apparatus 200 is the same as the apparatus disclosed in Japanese Patent Application Laid-Open No. 2000-277412. Referring to FIG. 4, a laser beam emitted from a light source 210 is converted by a beam shaping optical system 212 into a beam that is symmetrical in shape with respect to the optical axis and guided to an optical path switching mirror 214. The optical path switching mirror 214 is removed from the optical path when the apparatus is performing a normal exposure process.

The light flux emergent from the beam shaping optical system 212 is made incident on an incoherency-generating optical system 216 so that the coherency of the light is reduced. The light is then made to pass through an illumination optical system 218 to illuminate a mask (or a mask surface) 220. The light transmitted through the mask 220 that reflects a mask pattern is focused at a position of the wafer surface 224a by a projection optical system 222. It should be noted that in FIG. 4, the wafer 224 is not set at the wafer surface position 224a since FIG. 4 does not show a state under the exposure process. Under the exposure process, the wafer 224 is moved to the wafer surface position 224a by means of a wafer stage 226.

On the other hand, when the wavefront aberration of the projection optical system 222 is to be measured, the optical path switching mirror 214 is disposed in the optical path. In addition, the aperture diameter of the aperture stop 222a, which changes the numerical aperture of the projection optical system 222, is driven by a control portion 174 of a numerical aperture changing means 170 via a driving portion 172 so that the numerical aperture of the projection optical system 222 is changed to the maximum numerical aperture $NA_1$ larger than the maximum numerical aperture $NA_0$ under the normal exposure process (actual exposure operation). In this process, the control portion 174 controls the driving portion 172 in such a way that the numerical aperture $NA_0$ and the numerical aperture $NA_1$ of the projection optical system 222 satisfy the relationship of formula 1. Under this state, the light flux emergent from the beam shaping optical system 212 is reflected by the optical path switching mirror 214 and introduced into a deflecting optical system 230 so as to be guided to the vicinity of an interferometer unit 120. The light flux emergent from the deflecting optical system 230 is focused by a condenser lens 232 to one point. In the vicinity of the condenser lens 232, there is provided a pinhole 234.

The light flux having passed through the pinhole 234 is converted into parallel light by a collimator lens 236. The diameter of the pinhole 234 is set to be substantially equal to the Airy disk diameter that is determined by the numerical aperture (NA) of the collimator lens 236. Consequently, the light flux emergent from the pinhole 234 comprises a substantially ideal spherical wave. The parallel light emergent from the collimator lens 236 is reflected by a half mirror 238 and made incident on a TS lens 150 provided on a TS-XYZ stage 140 via a mirror M4. The light flux incident on the TS lens 150 is split into measurement light and reference light as described before, so that interference fringes are formed in the interferometer unit 120. Based on these interference fringes, the wavefront aberration of the projection optical system 222 can be measured with high precision.

After the measurement of the wavefront aberration of the projection optical system 222, the aperture stop 222a is driven by the numerical aperture changing means 170 so that the numerical aperture of the projection optical system is changed back to the numerical aperture under the normal exposure process and the optical path switching mirror 214 is switched to the illumination optical system 218 side, so that a exposure process is performed. However, in the case that the projection optical system 222 is required to have highly precise optical performance, there may be provided correction means 250 for correcting the wavefront aberration by, for example, adjusting the interval or position of the component projection lenses based on a measurement result after the wavefront aberration measurement.

Figure 5:
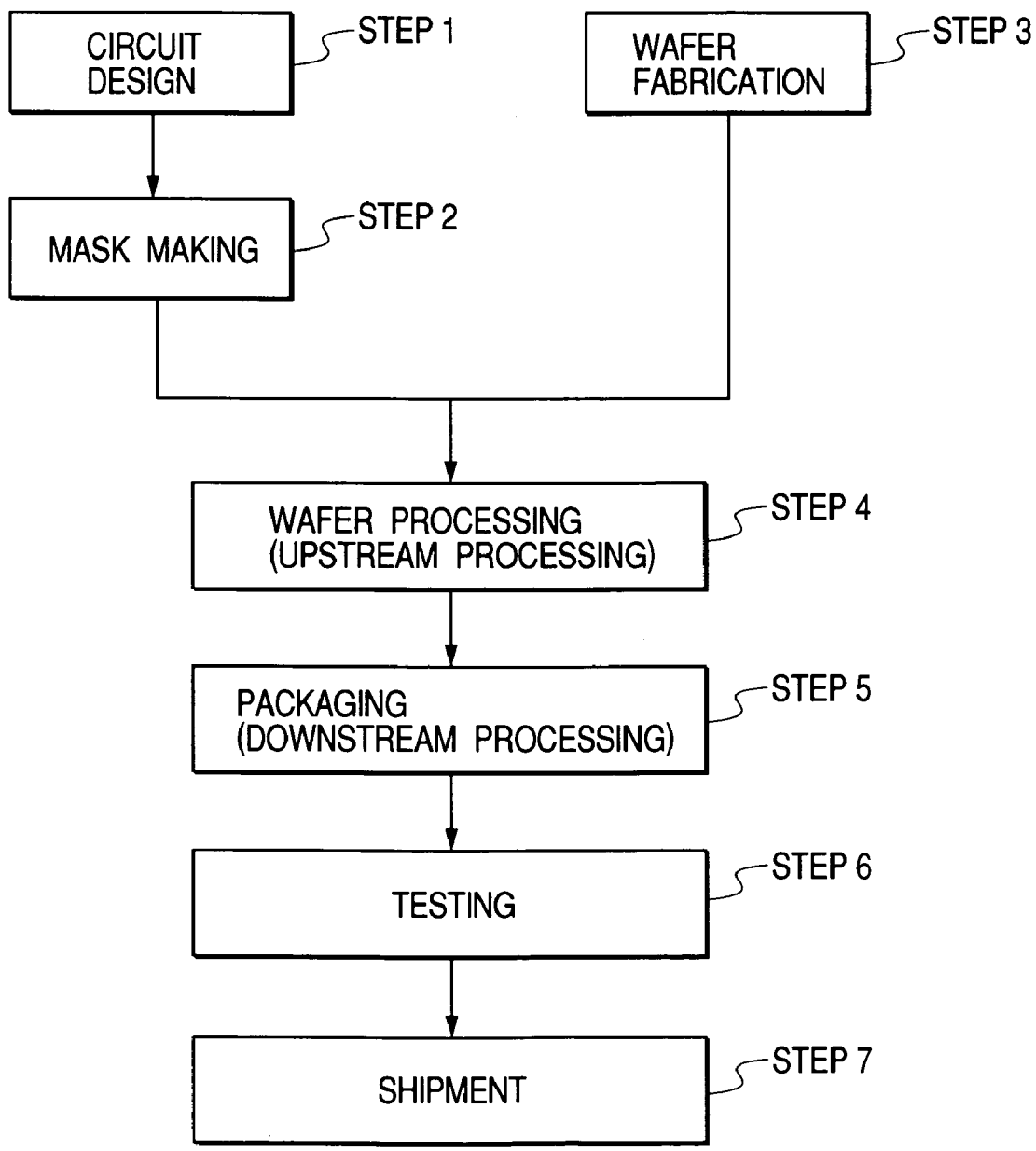
FIG. 5 is a flow chart illustrating a manufacturing process of devices (e.g. semiconductor chips such as ICs or LSIs, LCDs and CCDs etc.).

In the following, an embodiment of a device manufacturing process utilizing the exposure apparatus 200 will be described with reference to FIGS. 5 and 6. FIG. 5 is a flow chart for illustrating a manufacturing process of devices (e.g., semiconductor chips such as ICs or LSIs, LCDs or CCDs etc.). Here, a manufacturing process of semiconductor chips will be described by way of example. In step 1 (circuit design), the circuit of the device is designed. In step 2 (mask making), a mask on which a pattern of the designed circuit is formed is produced. In step 3 (wafer fabrication), a wafer is produced using silicon or like materials. In step 4 (wafer process), which is called an upstream processing, circuits are actually formed on the wafer by a lithography technology using the mask. Step 5 (packaging) is called a downstream processing in which semiconductor chips are produced from the wafer processed in step 4. Step 5 includes an assembling process (i.e. dicing and bonding) and a packaging process (i.e. chip packaging) etc. In step 6 (testing), inspections such as an operation test and durability test etc. of the semiconductor devices produced in step 5 are performed. Then, the finished semiconductor devices produced by the above-described processes are shipped (step 7).

FIG. 6 is the detailed flow chart of the wafer process of step 4. In step 11 (oxidation), the surface of the wafer is oxidized. In step 12 (CVD), an insulating film is formed on the surface of the wafer. In step 13 (electrode formation), electrodes are formed on the wafer by vapor deposition or the like process. In step 14 (ion implantation), ions are implanted into the wafer. In step 15 (resist processing), a photosensitive material is applied on the wafer. In step 16 (exposure), a circuit pattern on the mask is exposed (or transferred) onto the wafer using the exposure apparatus 200. In step 17 (developing), the wafer that has been exposed is developed. In step 18 (etching), the portions other than the developed resist image are etched away. In step 19 (resist stripping), the useless resist after the etching is removed. The above-described steps are repeated multiple times, so that multi-layered circuit patterns are formed on the wafer. With the device manufacturing process according to this embodiment, it is possible to manufacture devices having an improved quality as compared to conventional devices. As per the above, the device manufacturing method using the exposure apparatus 200 and resultant products in the form of the devices are also included in the scope of the present invention.

While preferred embodiments of the present invention have been described in the forgoing, it is apparent that the present invention is not limited to those embodiments, but various modification or changes can be made on them within the scope of the present invention. For example, although in the above described embodiments, light is made incident on the lens to be measured from the object plane side, light may be made incident on the lens from the image plane side.

What is claimed is:

1. An aberration measuring method in which a light flux converged by a condensing optical system is made incident on an optical system to be measured, the light flux that has passed through said optical system to be measured is reflected by a reflecting optical system having a center of curvature at a light convergence point on a light emergence side of said optical system to be measured is made incident on said optical system to be measure again, and wavefront aberration of said optical system to be measured is detected as interference fringes using the light flux that has passed through said optical system to be measured again, comprising:

a step of setting a numerical aperture of said optical system to be measured to a numerical aperture larger than a maximum numerical aperture in a case that said optical system is actually used; and a step of measuring wavefront aberration of said optical system at a set numerical aperture.

2. An aberration measuring method according to claim 1, wherein letting $NA_0$ be said maximum numerical aperture in the case that said optical system to be measured is actually used and letting $NA_1$ be said set numerical aperture, the following condition is satisfied:

$$NA_0/NA_1 < 0.995.$$

\* \* \* \* \*

UNITED STATES PATENT AND TRADEMARK OFFICE
CERTIFICATE OF CORRECTION

PATENT NO.       : 7,095,509 B2
APPLICATION NO.  : 10/791081
DATED            : August 22, 2006
INVENTOR(S)      : Osamu Kakuchi It is certified that error appears in the above-identified patent and that said Letters Patent is hereby corrected as shown below:

In Column 10, Line 26:

change "measure" to --measured--.

Signed and Sealed this

Twenty-third Day of January, 2007

JON W. DUDAS
*Director of the United States Patent and Trademark Office*